United States Patent
Yu

(10) Patent No.: US 10,490,611 B2
(45) Date of Patent: Nov. 26, 2019

(54) OLED DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Wei Yu, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 6 days.

(21) Appl. No.: 15/579,952

(22) PCT Filed: Nov. 16, 2017

(86) PCT No.: PCT/CN2017/111268
§ 371 (c)(1),
(2) Date: Dec. 6, 2017

(87) PCT Pub. No.: WO2019/061734
PCT Pub. Date: Apr. 4, 2019

(65) Prior Publication Data
US 2019/0103447 A1    Apr. 4, 2019

(30) Foreign Application Priority Data

Sep. 30, 2017    (CN) .......................... 2017 1 0919154

(51) Int. Cl.
*H01L 27/32* (2006.01)
*H01L 51/52* (2006.01)
*G02F 1/29* (2006.01)
*G02B 27/22* (2018.01)

(52) U.S. Cl.
CPC ............ *H01L 27/3232* (2013.01); *G02F 1/29* (2013.01); *H01L 51/5281* (2013.01); *G02B 27/2214* (2013.01); *G02F 2201/121* (2013.01); *G02F 2201/30* (2013.01); *G02F 2201/44* (2013.01); *G02F 2202/16* (2013.01); *H01L 51/5253* (2013.01)

(58) Field of Classification Search
CPC ............ H04N 13/0409; H01L 27/3232; H01L 52/5281; H01L 51/5253; G02F 2202/16; G02F 2201/44; G02F 2201/30; G02F 2201/121; G02B 27/2214
USPC .......................................................... 349/15
See application file for complete search history.

(56) References Cited

U.S. PATENT DOCUMENTS

| | | | |
|---|---|---|---|
| 2018/0192038 A1* | 7/2018 | Smith ................ | G02B 27/2214 |
| 2018/0199030 A1* | 7/2018 | Smith ................ | G02B 27/2214 |

* cited by examiner

*Primary Examiner* — Charles S Chang
(74) *Attorney, Agent, or Firm* — Mark M. Friedman

(57) ABSTRACT

The present disclosure provides an organic light-emitting diode (OLED) display panel, which includes a first substrate; a plurality of OLED devices are arranged on the first substrate; an encapsulation layer is arranged on the OLED devices; a polarization layer is located on the encapsulation layer; a plurality of first strip electrodes are located on the polarizing layer; a plurality of second strip electrodes are located below the second substrate, the second strip electrodes correspond to positions of the first strip electrodes; and a polarizer is disposed on the second substrate.

7 Claims, 1 Drawing Sheet

OLED DISPLAY PANEL AND DISPLAY DEVICE

BACKGROUND OF DISCLOSURE

Field of Disclosure

The present disclosure relates to the field of display technology, and particularly to an organic light-emitting diode (OLED) display panel and a display device.

Description of Prior Art

With development of display technology, demand for 3-dimensional (3D) display devices is increasing day by day, especially for naked-eye 3D, which can display 3D images without external devices (such as 3D glasses).

Conventional naked-eye 3D technology mainly uses principle of binocular parallax to generate a 3D experience. A left eye can receive only left-eye images and a right eye can receive only right-eye images, mainly based on light adjustment.

There are several ways to achieve a naked-eye 3D display. Light barrier 3D technology is also called parallax barrier or parallax barrier technology. Compatibility of the light-barrier 3D display between a liquid crystal display (LCD) process is that a current LCD panel is set as a liquid crystal grating. When a 3D display is performed, the liquid crystal grating electrode is powered on. Because liquid crystal molecules between upper and the lower substrates are twisted, at this time, a left eye and right eye of a viewer observe displayed left-eye images and displayed right-eye images, respectively, and a 3D image is formed through brain synthesis. When a 2-dimensional (2D) display is performed, the liquid crystal grating controls rotation of the liquid crystal molecules. Light all can penetrate the liquid crystal grating, at this time, a 2D image is displayed by the OLED and received by a human's eyes by penetrating the liquid crystal grating.

However, a conventional light barrier 3D display needs a backlight module for the LCD panel, so thickness is relatively thick. In order to obtain a relatively thin light barrier 3D display, an organic light-emitting diode (OLED) display panel replaces an LCD panel, so that the OLED display panel and the liquid crystal grating are combined as shown in FIG. 1. The conventional barrier naked-eye 3D display comprises an OLED panel and a liquid crystal panel. The OLED panel comprises an OLED substrate 11 and a first glass substrate 13. A color OLED matrix 12 is disposed between the OLED substrate 11 and the first glass substrate 13, the OLED substrate 11 and the first glass substrate 13 are sealed by sealant 19. The liquid crystal panel comprises a stacked lower polarizer 15, a thin film transistor (TFT) array substrate 16, a second glass substrate 17, and an upper polarizer 18. A liquid crystal layer is disposed between the second glass substrate 17 and the TFT array substrate 16, a black matrix 20 is disposed on one side of the second glass substrate 17 opposite to the liquid crystal layer, the second glass substrate 17 and the TFT array substrate 16 are sealed by the sealant 19, the first glass substrate 13 and the lower polarizer 15 are bonded by OCA glue 14. The conventional light-barrier 3D display requires four substrates, and the OCA glue is needed for a full adhesion between the OLED and the LCD. As a result, the overall thickness is relatively thick, so the requirements for lightness and thinness are not met.

Therefore, it is necessary to provide an OLED display and a display device to solve the problems in the conventional art.

SUMMARY OF DISCLOSURE

The objective of the present disclosure is to provide an organic light-emitting diode (OLED) display panel and a display device, which are able to reduce the thickness of the display device.

In order to solve the above technical problem, the present disclosure provides an OLED display panel, which comprises: a first substrate; a plurality of OLED devices arranged on the first substrate; an encapsulation layer arranged on the OLED devices; a polarization layer located on the encapsulation layer; a plurality of first strip electrodes located on the polarizing layer; a second substrate located opposite to the first substrate; a plurality of second strip electrodes located on a side of the second substrate close to the first substrate, the second strip electrodes correspond to positions of the first strip electrodes; a liquid crystal layer located between the first substrate and the second substrate; and a polarizer disposed on a side of the second substrate away from the first substrate.

When a two-dimensional display is performed, voltages input to the first strip electrodes and the second strip electrodes are equal to each other.

When a three-dimensional display is performed, voltages input to the first strip electrodes and the second strip electrodes are not equal.

In the OLED display panel of the present disclosure, the first strip electrodes are spaced apart from each other, the second strip electrodes are also spaced apart from each other, wherein a pitch between the second strip electrodes is larger than a pitch between the first strip electrodes.

In the OLED display panel of the present disclosure, material of the first strip electrode comprises indium tin oxide.

In the OLED display panel of the present disclosure, the second strip electrodes correspond to positions of the first strip electrodes, and a number of the second strip electrodes is equal to a number of the first strip electrodes.

The present disclosure further provides an OLED display panel, which comprises: a first substrate; a plurality of OLED devices arranged on the first substrate; an encapsulation layer arranged on the OLED devices; a polarization layer located on the encapsulation layer; a plurality of first strip electrodes located on the polarizing layer; a second substrate located opposite to the first substrate; a plurality of second strip electrodes located on a side of the second substrate close to the first substrate, the second strip electrodes correspond to positions of the first strip electrodes; and a liquid crystal layer located between the first substrate and the second substrate.

In the OLED display panel of the present disclosure, the OLED display panel further comprises a polarizer disposed on a side of the second substrate away from the first substrate.

In the OLED display panel of the present disclosure, when a two-dimensional display is performed, voltages input to the first strip electrodes and the second strip electrodes are equal to each other.

In the OLED display panel of the present disclosure, when a three-dimensional display is performed, voltages input to the first strip electrodes and the second strip electrodes are not equal.

In the OLED display panel of the present disclosure, the first strip electrodes are spaced apart from each other, the second strip electrodes are also spaced apart from each other, wherein a pitch between the second strip electrodes is larger than a pitch between the first strip electrodes.

In the OLED display panel of the present disclosure, material of the first strip electrode comprises indium tin oxide.

In the OLED display panel of the present disclosure, the second strip electrodes correspond to positions of the first strip electrodes, and a number of the second strip electrodes is equal to a number of the first strip electrodes.

In the OLED display panel of the present disclosure, the second strip electrodes correspond to positions of the first strip electrodes, and a number of the second strip electrodes is equal to a number of the first strip electrodes.

The present disclosure further provides a display device, which comprises an OLED display panel, the OLED display panel comprises: a first substrate; a plurality of OLED devices arranged on the first substrate; an encapsulation layer arranged on the OLED devices; a polarization layer located on the encapsulation layer; a plurality of first strip electrodes located on the polarizing layer; a second substrate located opposite the first substrate; a plurality of second strip electrodes located on a side of the second substrate close to the first substrate, the second strip electrodes correspond to positions of the first strip electrodes; and a liquid crystal layer located between the first substrate and the second substrate.

In the OLED display device of the present disclosure, the OLED display panel further comprises a polarizer disposed on a side of the second substrate away from the first substrate.

In the OLED display device of the present disclosure, when a two-dimensional display is performed, voltages input to the first strip electrodes and the second strip electrodes are equal to each other.

In the OLED display device of the present disclosure, when a three-dimensional display is performed, voltages input to the first strip electrodes and the second strip electrodes are not equal.

In the OLED display device of the present disclosure, the first strip electrodes are spaced apart from each other, the second strip electrodes are also spaced apart from each other, wherein a pitch between the second strip electrodes is larger than a pitch between the first strip electrodes.

In the OLED display device of the present disclosure, material of the first strip electrode comprises indium tin oxide.

In the OLED display device of the present disclosure, the second strip electrodes correspond to positions of the first strip electrodes, and a number of the second strip electrodes is equal to a number of the first strip electrodes.

The OLED display panel and display device of the present disclosure reduce the number of substrates by improving the structure of the conventional three-dimensional display panel, so as to reduce the overall thickness of the display panel.

BRIEF DESCRIPTION OF DRAWINGS

To describe the technical solutions in the embodiments or in the conventional art more clearly, the following is a brief introduction of the accompanying drawings required for describing the embodiments or the conventional art. The accompanying drawings in the following description show merely some embodiments of the present disclosure. For some embodiments, those skilled in the art can obtain other drawings according to the accompanying drawings without creative efforts.

DETAILED DESCRIPTION OF PREFERRED EMBODIMENTS

Figure 1:
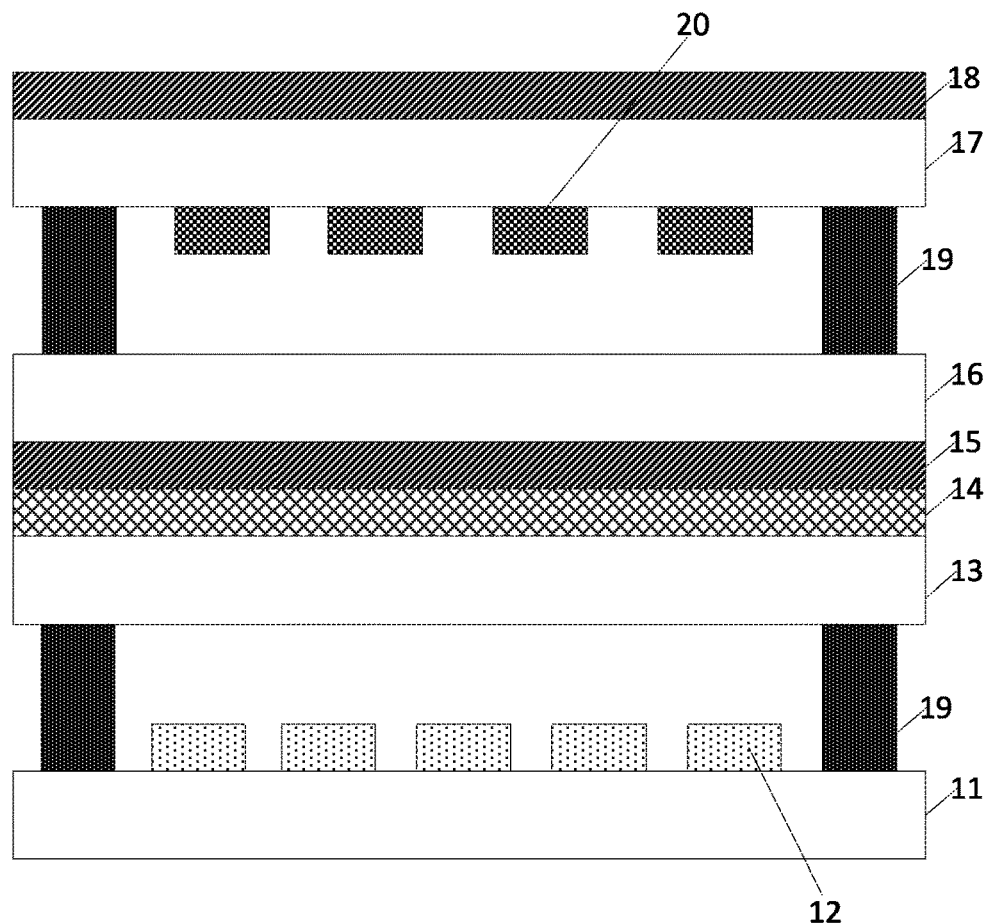
FIG. 1 is a structural illustrative drawing of a conventional organic light-emitting diode (OLED) display panel.

The following description of the embodiments is directed to the attached drawings for illustrating specific embodiments in which the disclosure may be practiced. The terms of the present disclosure, such as "up", "down", "front", "post", "left", "right", "inside", "outside", "side", are merely directions referring to the attached drawings. Thus, the directional language used is for the purpose of illustrating and understanding the disclosure and is not intended to be limiting of the disclosure. In the figure, units with similar structures are denoted by the same reference numerals.

Figure 2:
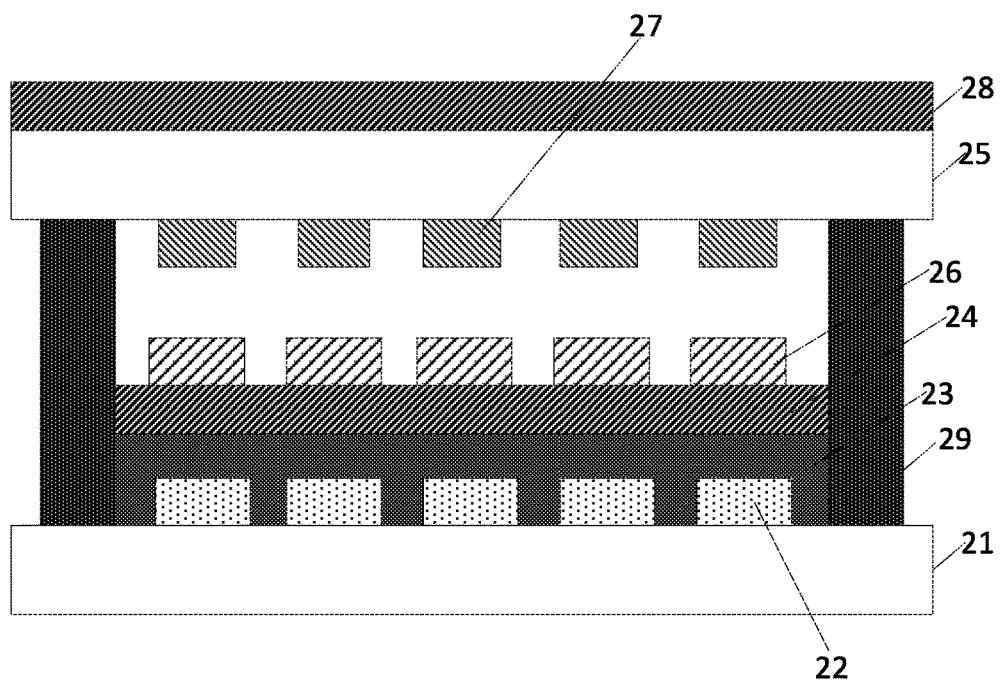
FIG. 2 is a structural illustrative drawing of an OLED display panel according to the present disclosure.

Please refer to FIG. 2, which is a structural illustrative drawing of an organic light-emitting diode (OLED) display panel according to the present disclosure.

As shown in FIG. 2, the OLED display panel of the present disclosure comprises a first substrate 21, a second substrate 25, a liquid crystal layer, a plurality of OLED devices 22, an encapsulation layer 23 a polarization layer 24, a plurality of first strip electrodes 26, a plurality of second strip electrodes 27, and a polarizer 28.

The second substrate 25 is located opposite to the first substrate 21. The liquid crystal layer (not shown in FIG. 2) is located between the first substrate 21 and the second substrate 25. The first substrate 21 and the second substrate 25 seal the liquid crystal via a sealant 29.

The plurality of OLED devices 22 are arranged on the first substrate 21. The encapsulation layer 23 is arranged on the OLED devices 22. The polarization layer 24 is located on the encapsulation layer 23. The OLED device 22 can emit a light and dark colored stripe under driving of a driving array.

The plurality of first strip electrodes 26 are located on the polarizing layer 24. The first strip electrodes 26 are spaced apart from each other.

In one embodiment, the plurality of first strip electrodes 26 are transparent electrodes, material of the first strip electrode 26 comprises indium tin oxide (ITO).

The plurality of second strip electrodes 27 are located below the second substrate 25, in other words, the plurality of second strip electrodes 27 are located on a side of the second substrate 25 close to the liquid crystal layer. The second strip electrodes 27 are spaced apart from each other.

The second strip electrodes 27 correspond to positions of the first strip electrodes 26. A number of the second strip electrodes 27 is equal to a number of the first strip electrodes 26.

In one embodiment, a pitch between the second strip electrodes 27 is larger than a pitch between the first strip electrodes 26. In other words, a width of the second strip electrodes 27 is larger than a width of the first strip electrodes 26.

The first strip electrodes 26 and the second strip electrodes 27 are driven by the control chip to realize function of a liquid crystal lens or a liquid crystal grating.

The polarizer 28 is disposed on the second substrate 25, in other words, on a side of the second substrate 25 away from the liquid crystal layer.

When a two-dimensional display is performed, voltages input to the first strip electrodes 26 and the second strip electrodes 27 are equal to each other, to drive the liquid crystal molecules rotating, the image displayed by the OLED all passing through the liquid crystal grating, meanwhile, the liquid crystal grating is similar to a transparent state, human eyes will receive a 2D image displayed by the OLED display device.

When a three-dimensional display is performed, voltages input to the first strip electrodes 26 and the second strip electrodes 27 are not equal, to chive the liquid crystal molecules to rotate, the image displayed by the OLED could not entirely pass through the liquid crystal grating, the liquid crystal grating forms a stripe with light and dark, meanwhile, after blocking and filtering with the stripe with light and dark of the liquid crystal grating, the left eye and the right eye of a human will respectively receive a displayed left-eye image and right-eye image, and a 3D image is formed by synthesis in the brain.

The 3D display panel can be coordinated with a human-eye tracking system to adjust the voltage between the upper and lower electrodes corresponding to the liquid crystal grating, when the human eye is moving so that the movement of the stripe with light and dark can be adjusted synchronously, so that the human eye can receive the best 3D display effect, then the 3D monitor perspective is increased.

Although the present disclosure is disclosed as preferred embodiments, the foregoing preferred embodiments are not intended to limit the present disclosure. Those of ordinary skill in the art, without departing from the spirit and scope of the present disclosure, can make various kinds of modifications and variations to the present disclosure. Therefore, the scope of the claims of the present disclosure must be defined.

What is claimed is:

1. An organic light-emitting diode (OLED) display panel, comprising:
    a first substrate;
    a plurality of OLED devices arranged on the first substrate;
    an encapsulation layer arranged on the OLED devices;
    a polarization layer located on the encapsulation layer;
    a plurality of first strip electrodes located on the polarizing layer;
    a second substrate located opposite the first substrate;
    a plurality of second strip electrodes located on a side of the second substrate close to the first substrate the second strip electrodes corresponding to positions of the first strip electrodes;
    a liquid crystal layer located between the first substrate and the second substrate; and
    a polarizer disposed on a side of the second substrate away from the first substrate;
    wherein when a two-dimensional display is performed, voltages input to the first strip electrodes and the second strip electrodes are equal to each other;
    wherein when a three-dimensional display is performed, voltages input to the first strip electrodes and the second strip electrodes are not equal, and wherein the first strip electrodes are spaced apart from each other, the second strip electrodes are also spaced apart from each other, a pitch between the second strip electrodes is larger than a pitch between the first strip electrodes, a number of the second strip electrodes is equal to a number of the first strip electrodes, and each of the second strip electrodes corresponds to a position of each of the first strip electrodes, such that each of the second strip electrodes is coaxial to a corresponding first stirp electrode in a perpendicular direction.

2. The OLED display panel according to claim 1, wherein material of the first strip electrode comprises indium tin oxide.

3. A display device, comprising an organic light-emitting diode (OLED) display panel, the OLED display comprising:
    a first substrate;
    a plurality of OLED devices arranged on the first substrate;
    an encapsulation layer arranged on the OLED devices;
    a polarization layer located on the encapsulation layer;
    a plurality of first strip electrodes located on the polarizing layer;
    a second substrate located opposite to the first substrate;
    a plurality of second strip electrodes located on a side of the second substrate close to the first substrate the second strip electrodes corresponding to positions of the first strip electrodes;
    a liquid crystal layer located between the first substrate and the second substrate;
    wherein the first strip electrodes are spaced apart from each other, the second strip electrodes are also spaced apart from each other, a pitch between the second strip electrodes is larger than a pitch between the first strip electrodes, a number of the second strip electrodes is equal to a number of the first strip electrodes, and each of the second strip electrodes corresponds to a position of each of the first strip electrodes, such that each of the second strip electrodes is coaxial to a corresponding first stirp electrode in a perpendicular direction.

4. The OLED display device according to claim 3, wherein the OLED display panel further comprises:
    a polarizer disposed on a side of the second substrate away from the first substrate.

5. The OLED display device according to claim 3, wherein when a two-dimensional display is performed, voltages input to the first strip electrodes and the second strip electrodes are equal to each other.

6. The OLED display device according to claim 3, wherein when a three-dimensional display is performed, voltages input to the first strip electrodes and the second strip electrodes are not equal.

7. The OLED display device according to claim 3, wherein material of the first strip electrode is indium tin oxide.

* * * * *